United States Patent
Lin et al.

[11] Patent Number: 6,155,845
[45] Date of Patent: Dec. 5, 2000

[54] ELECTRICAL CONTACT FOR BALL GRID ARRAY SOCKET

[75] Inventors: Yu-Hsu Lin, Fremont, Calif.; Ming-Lun Szu, Taipei, Taiwan

[73] Assignee: Hon Hai Precision Ind. Co., Ltd., Taipei Hsien, Taiwan

[21] Appl. No.: 09/222,239

[22] Filed: Dec. 28, 1998

[51] Int. Cl.⁷ .................................................. H01R 12/00
[52] U.S. Cl. ............................................... 439/83; 439/78
[58] Field of Search .................................. 439/83, 78, 55, 439/80, 81, 82, 876, 874, 875; 29/860

[56] References Cited

U.S. PATENT DOCUMENTS

| | | | |
|---|---|---|---|
| 5,489,218 | 2/1996 | McHugh | 439/342 |
| 5,562,474 | 10/1996 | Lee | 439/342 |
| 5,632,629 | 5/1997 | Legrady | 439/78 |
| 5,909,011 | 7/1999 | Chartrand et al. | 174/261 |
| 5,934,951 | 8/1999 | Lai et al. | 439/876 |
| 5,947,778 | 9/1999 | Lai et al. | 439/876 |

*Primary Examiner*—Renee Luebke
*Assistant Examiner*—Michael C. Zarroli
*Attorney, Agent, or Firm*—Wei Te Chung

[57] ABSTRACT

An electrical contact for use with a BGA socket comprises an engaging section and a connecting section attached thereto. The connecting section comprises a circular solder plate attached directly below an elongate body of the engaging section thereby providing the contact with increased durability. The engaging section is inserted into the corresponding passageway of the housing from a bottom surface thereof whereby the circular solder plate effectively covers an opening of the passageway. Flux is applied to the solder plates of the contacts by means of a screening process and the contacts will not deform under pressure of a squeegee. A solder ball is attached to the solder plate and positioning mechanism ensures that the solder ball adheres to a central portion thereof.

21 Claims, 5 Drawing Sheets

ELECTRICAL CONTACT FOR BALL GRID ARRAY SOCKET

BACKGROUND OF THE INVENTION

1. Field of the Invention

The present invention relates to an electrical contact, and more particularly to an electrical contact for use with a ball grid array socket.

2. The Prior Art

Ball Grid Array (BGA) sockets are commonly used for mounting a CPU to a printed circuit board. Contacts are assembled within the socket and flux is applied to solder plates thereof by a screening process during which a squeegee is used to spread the flux evenly across the solder plates. Since the conventional contacts are L-shaped with the solder plates formed on an arm extending from a main body of the contact, pressure from the squeegee will cause the contacts to deform. Additionally, when a solder ball is attached to the solder plate of the contact due to the adhesive qualities of the flux, the solder ball often drifts from a central portion of the solder plate before the flux dries and hardens whereby the solder ball is not centered on the solder plate which may result in a short circuit between neighboring contacts or otherwise adversely affect signal transmission. Furthermore, the contacts are usually inserted into passageways defined through the BGA socket from a bottom surface thereof. However, openings of the passageways are not completely covered whereby excess flux or foreign matter may enter the passageway thereby adversely affecting signal transmission. Therefore, an improved electrical contact for use in a BGA socket is required which can overcome the above-mentioned drawbacks.

SUMMARY OF THE INVENTION

Accordingly, one objective of the present invention is to provide an electrical contact for use in a BGA socket, having a solder plate for electrically connecting with a solder pad formed on a PCB wherein the solder plate is located directly below a main body of the contact whereby deformation of the contact during a screening process is effectively eliminated, the contact is stably engaged with a housing of the BGA socket, and the electrical path through the contact is shortened.

Another objective of the present invention is to provide an electrical contact having a solder plate with positioning means whereby a solder ball can be adhered to the solder plate by means of flux and the positioning means prevents the solder ball from drifting away from a central portion of the solder plate before the flux dries and hardens.

A further objective of the present invention is to provide an electrical contact for insertion into a passageway defined in a housing of a BGA socket, having a circular solder plate which effectively blocks an opening of the passageway thereby preventing excess flux or foreign matter from entering into the passageway.

Yet another objective of the present invention is to provide an electrical contact for a BGA socket, having an engaging section and a connecting section separately formed and attached together whereby a solder plate of the connecting section can be suitably sized to fulfill the requirements of a specific application without changing the dimension of the engaging section.

To fulfill the above objectives, an electrical contact for use with a BGA socket in accordance with a first embodiment of the present invention, comprises an engaging section and a connecting section attached thereto. The engaging section comprises an elongate main body and a pair of engaging protrusions downwardly extending therefrom. The connecting section comprises a circular solder plate defining a pair of openings in opposite edges thereof for snugly receiving the engaging protrusions of the engaging section. A wall downwardly extends from a periphery of the solder plate. The engaging section is inserted into the corresponding passageway of the housing from a bottom surface thereof whereby the circular solder plate effectively covers an opening of the passageway thereby preventing foreign matter from entering into the passageway.

Flux is applied to the solder plates of the contacts by means of a screening process performed on a bottom surface of the housing of the BGA socket. Since the solder plate is attached to the engaging section directly below the main body thereof, the contact is provided with increased durability and will not deform under pressure of a squeegee when the flux is applied thereto. A solder ball is then attached to the solder plate and the provision of the wall of the solder plate ensures that the solder ball adheres to a central portion of the solder plate. The flux is received in gaps defined between the openings of the solder plate and the engaging protrusion of the engaging section. When the flux dries and hardens the engagement between the engaging and connecting sections is further strengthened.

In accordance with a second embodiment of the present invention, the solder plate is a flat surface. When the contact is received in the corresponding passageway, the solder plate is positioned within the passageway whereby peripheral walls of the passageway adjacent to the bottom surface of the housing serve the same function as the wall extending from the solder plate in the first embodiment.

These and additional objectives, features, and advantages of the present invention will become apparent after reading the following detailed description of the preferred embodiments of the present invention taken in conjunction with the appended drawing figures.

BRIEF DESCRIPTION OF THE DRAWINGS

FIG. 2A is a partial, enlarged view of FIG. 2.

DETAILED DESCRIPTION OF THE PREFERRED EMBODIMENTS

Figure 1:
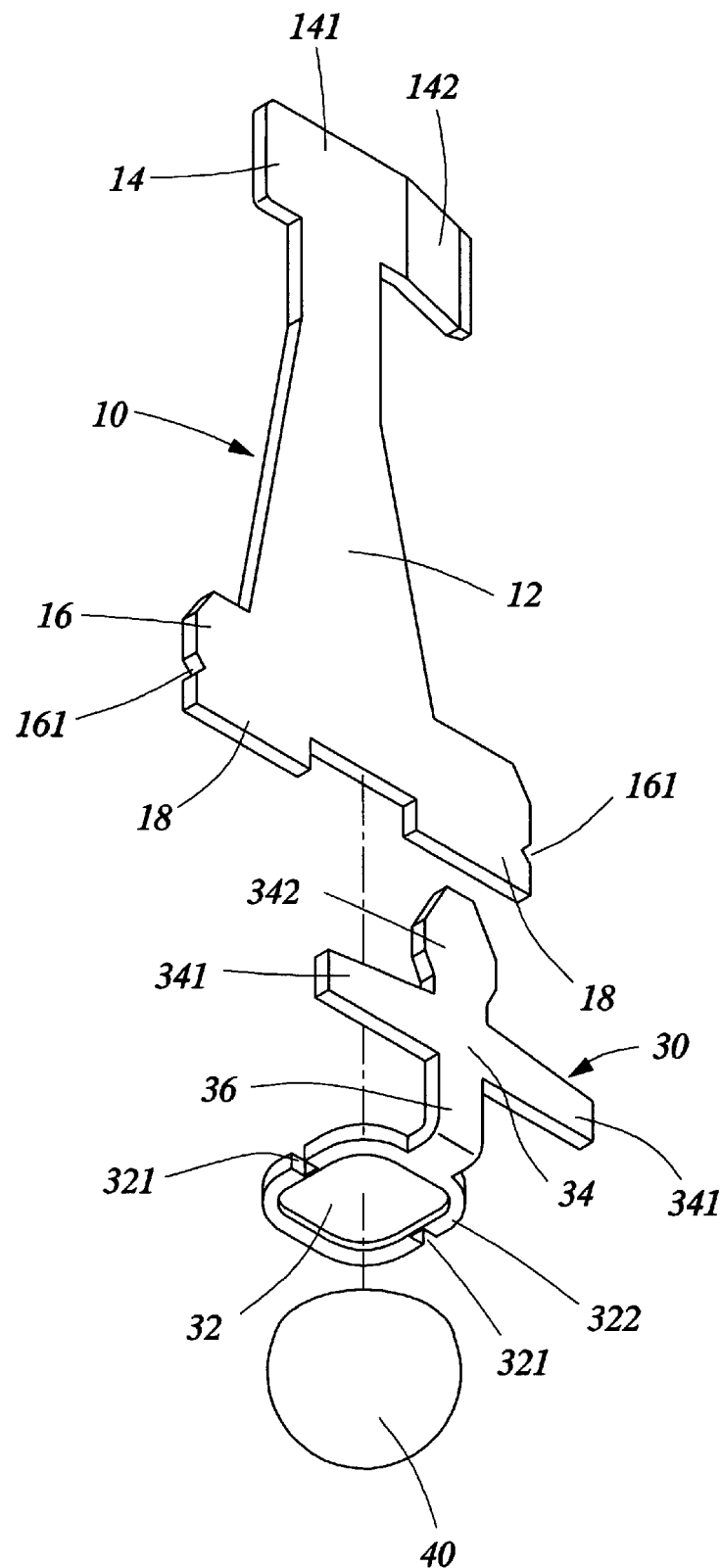
FIG. 1 is an exploded view of an electrical contact in accordance with a first embodiment of the present invention.

Detailed reference will now be made to the preferred embodiments of the present invention. Like reference numerals are used for like components throughout the various embodiments for facilitating understanding of the present invention.

Referring to FIGS. 1 to 4, an electrical contact in accordance with a first embodiment of the present invention for use with a BGA socket 2 defining a plurality of passageways 20 in a housing 22 thereof, comprises an engaging section 10 and a connecting section 30 attached thereto. The engaging section 10 comprises an elongate main body 12, an engaging plate 14 formed at one end of the main body 12, a retaining plate 16 formed at an opposite end of the main body 12, and a pair of engaging protrusions 18 downwardly extending from the retaining plate 16. The engaging plate 14 includes a first section 141 integrally formed with the main body 12 and a second section 142 extending from the first section 141 at an angle whereby a pin 3 of a CPU (not shown) abuts against the second section 142. The retaining plate 16 defines a pair of cutouts 161 in opposite lateral edges thereof for providing the retaining plate 16 with a certain degree of resiliency.

The connecting section 30 comprises a circular solder plate 32 and a retaining member 34 perpendicularly attached to the solder plate 32 by means of a curved portion 36. The retaining member 34 includes a pair of outwardly projecting barbs 341 connected to the curved portion 36 and a rounded free end 342 upwardly extending from a central junction between the barbs 341. A pair of openings 321 are defined in opposite edges of the solder plate 32 for snugly receiving the engaging protrusions 18 of the engaging section 10. A wall 322 downwardly extends from a periphery of the solder plate 32.

The connecting section 30 is attached to the engaging section 10 by inserting inner portions of the engaging projections 18 of the engaging section 10 into the openings 321 of the solder plate 32. The engaging section 10 is inserted into the corresponding passageway 20 of the housing 22 from a bottom surface thereof whereby the retaining member 34 of the connecting section 30 is retained in a recess 24 defined in the housing 22 proximate the passageway 20. The retaining plate 16 interferentially engages with inner surfaces of the corresponding passageway 20 due to the provision of the cutouts 161. The free end 342 of the connecting section 30 is interferentially received in the recess 24. The circular solder plate 32 effectively covers an opening of the passageway 20 thereby preventing foreign matter from entering into the passageway 20.

Flux is applied to the solder plates 32 of the contacts by means of a screening process performed on a bottom surface of the housing 22 of the BGA socket 2. Since the solder plate 32 is attached to the engaging section 10 directly below and substantially in alignment with the retention plate 16 thereof, the contact is provided with increased durability and will not deform under pressure of a squeegee when the flux is applied thereto. A solder ball 40 is then attached to the solder plate 32 by means of the adhesive quality of the flux. The provision of the wall 322 of the solder plate 32 ensures that the solder ball 40 adheres to a central portion of the solder plate 32. The flux is received in gaps 320 defined between the openings 321 of the solder plate 32 and the engaging protrusions 18 of the engaging section 10. When the flux dries and hardens the engagement between the engaging and connecting sections 10, 30 is further strengthened.

Figure 1A:
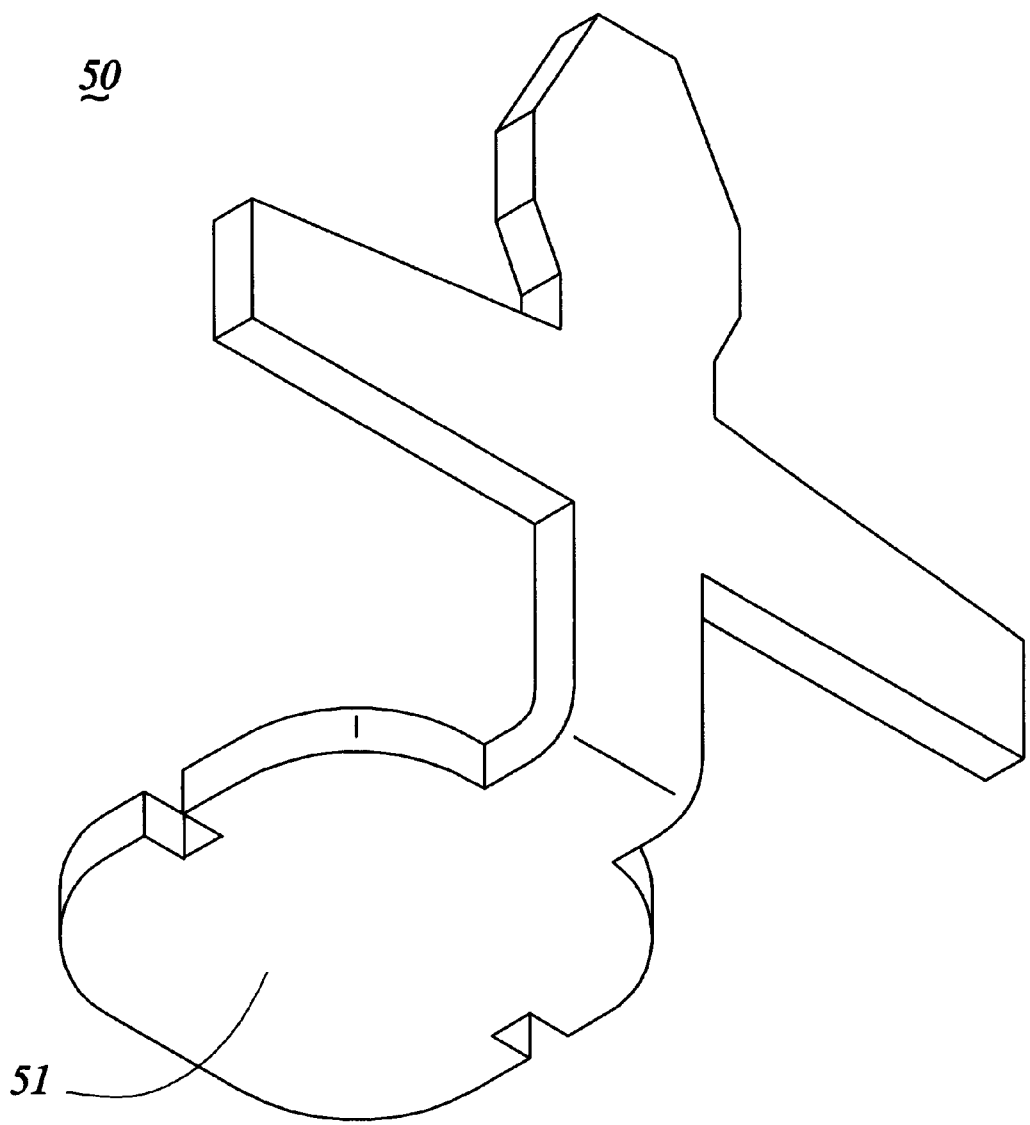
FIG. 1A is a perspective view of a connecting section of an electrical contact in accordance with a second embodiment of the present invention.
Figure 2:
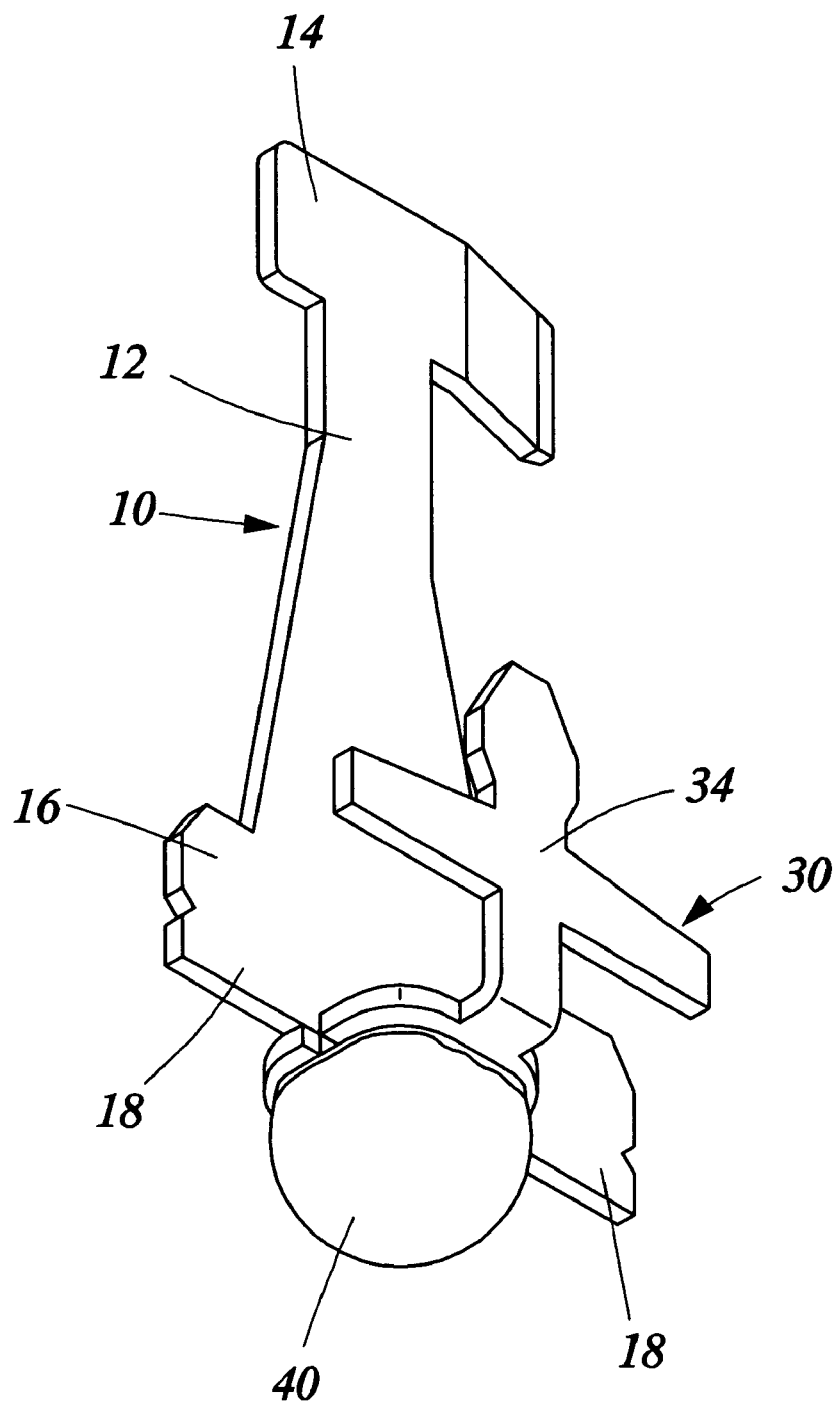
FIG. 2 is an assembled view of FIG. 1.
Figure 3:
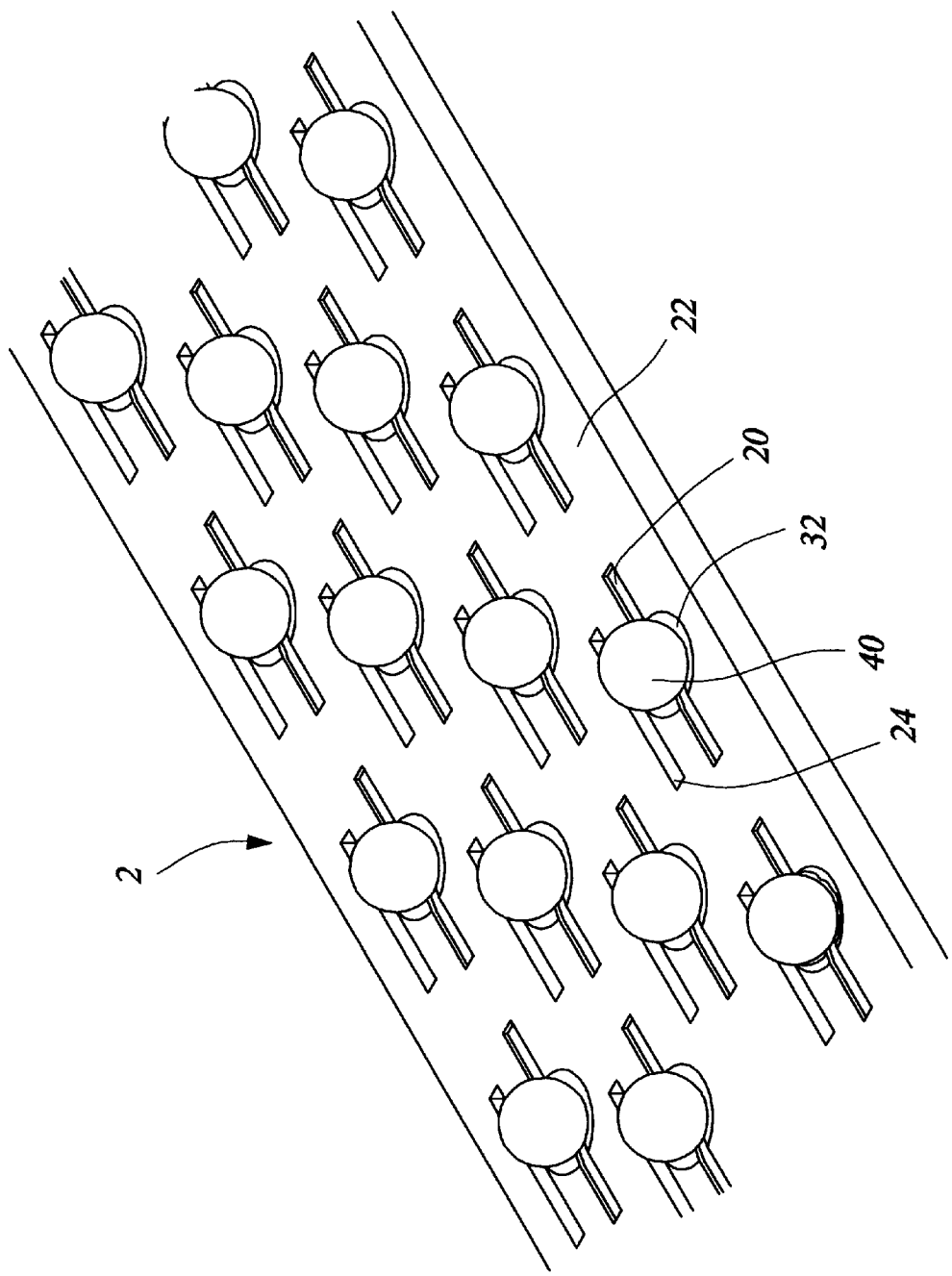
FIG. 3 is a bottom perspective view of a socket in accordance with the present invention with the contacts received in passageways thereof.
Figure 4:
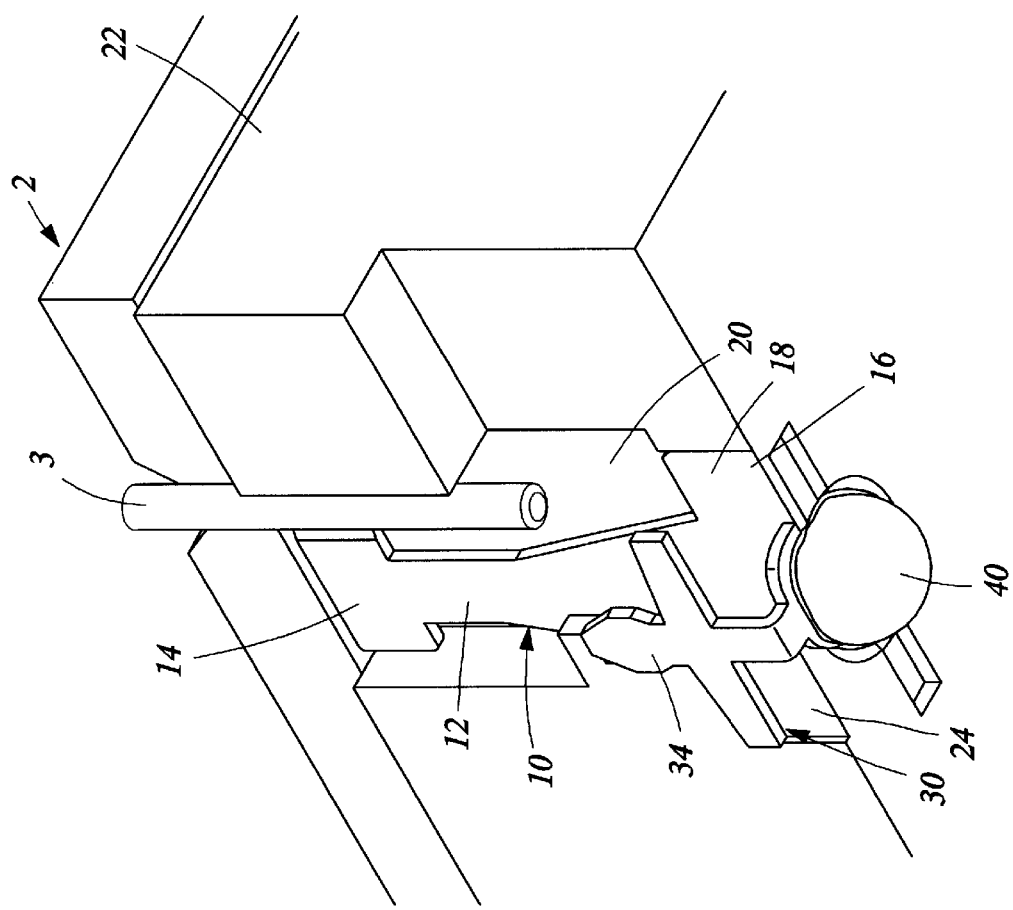
FIG. 4 is a cross sectional view of FIG. 3 showing the contact received in the passageway of the socket.

Also referring to FIG. 1A, a solder plate 51 of a connecting section 50 of a contact in accordance with a second embodiment of the present invention has a flat surface. When the contact is received in the corresponding passageway 20 of the housing 22, the solder plate 51 is positioned within the passageway 20 whereby peripheral walls (not labeled) of the passageway 20 adjacent to the bottom surface of the housing 22 ensure that a solder ball 40 will adhere to a central portion of the solder plate 51.

It is seen that in the embodiment the opening of the passageway 20 around the bottom surface is of a slit-like configuration and the contact is loaded into the corresponding passageway 20 from the top. Additionally, the bottom of the housing 22 around the opening of the passageway 20 also defines a recession for receiving the solder plate 32 therein. Under this situation, there is less possibility to have flux upward enter the passageway 20. In opposite, if the contact is loaded into the passageway from the bottom and thus the opening of the passageway around the bottom surface of the housing should be larger for allowing passage of the engaging plate from the bottom. Under this condition, the solder plate may efficiently prevent the flux from entering the passageway.

It is noted that different applications may require solder plates of different sizes. In the present invention, a connecting section having a solder plate of different size can be attached to an engaging section without changing the dimension thereof.

While the present invention has been described with reference to specific embodiments, the description is illustrative of the invention and is not to be construed as limiting the invention. Therefore, various modifications to the present invention can be made to the preferred embodiments by those skilled in the art without departing from the true spirit and scope of the invention as defined by the appended claims.

I claim:

1. A socket for mounting a CPU onto a printed circuit board comprising:

an insulative housing defining a plurality of passageways therein; and a plurality of electrical contacts received in the passageways, each contact comprising an engaging section and a connecting section attached thereto;

said engaging section comprising an elongate main body, an engaging plate formed at one end of the main body for engaging with a conductive pin of the CPU, and a retaining plate formed at an opposite end of the main body for retaining the contact within the corresponding passageway;

said connecting section comprising a solder plate attached to the retaining plate of the engaging section directly below and substantially in alignment with the retention plate thereof;

whereby the contact is provided with increased durability and will not deform under pressure of a squeegee when flux is applied to the solder plates by means of a screening process performed on a bottom surface of the housing.

2. The socket as described in claim 1, wherein at least an engaging protrusion downwardly extends from the retaining plate for engaging with corresponding openings defined in the solder plate.

3. The socket as described in claim 2, wherein the flux is received in gaps defined between the openings of each solder plate and the engaging protrusions of the corresponding engaging section whereby when the flux dries and hardens the engagement between the engaging and connecting sections is strengthened.

4. The socket as described in claim 1, wherein the connecting section further comprises a retaining member attached to the solder plate for being received in a recess defined in the housing proximate the passageway thereby strengthening retention of the contact within the housing.

5. The socket as described in claim 1, wherein the solder plate is circular.

6. A socket for mounting a CPU onto a printed circuit board, comprising:

an insulative housing defining a plurality of passageways therein; and a plurality of electrical contacts received in the passageways, each contact comprising an engaging section and a connecting section attached thereto;

said engaging section comprising an elongate main body, an engaging plate formed at one end of the main body for engaging with a conductive pin of the CPU, and a retaining plate formed at an opposite end of the main body for retaining the contact within the corresponding passageway;

said connecting section comprising a solder plate connected to the retaining plate of the engaging section;

wherein the solder plate of the connecting section effectively covers an opening of the passageway thereby preventing foreign matter from entering into the passageway and aiding proper positioning of corresponding solder balls in a central portion of the solder plate.

7. The socket as described in claim 6, wherein flux is applied to the solder plates of the contacts and the position of the solder plate prevents the flux from entering into the corresponding passageway.

8. The socket as described in claim 6, wherein the solder plate is circular.

9. An electrical contact for use with a socket defining a plurality of passageways in a housing thereof, comprising:

an engaging section having an elongate main body, an engaging plate formed at one end of the main body for engaging with a conductive pin of a CPU, and a retaining plate formed at an opposite end of the main body for retaining the contact within the corresponding passageway; and a connecting section comprising a solder plate defining a pair of openings on opposite edges for attaching to the retaining plate of the engaging section.

10. The contact as described in claim 9, wherein the solder plate is attached to the engaging section directly below and substantially in alignment with the retention plate thereof.

11. The contact as described in claim 9, wherein at least an engaging protrusion downwardly extends from the retaining plate for engaging with corresponding openings defined in the solder plate.

12. The contact as described in claim 9, wherein flux is received in gaps defined between the openings of each solder plate and the engaging protrusions of the corresponding engaging section whereby when the flux dries and hardens the engagement between the engaging and connecting sections is strengthened.

13. The contact as described in claim 9, wherein the connecting section further comprises a retaining member attached to the solder plate for being received in a recess defined in the housing proximate the passageway thereby strengthening retention of the contact within the housing.

14. The contact as described in claim 9, wherein the solder plate is circular.

15. The contact as described in claim 9, wherein positioning means is provided on the solder plate for ensuring that a solder ball adheres to a central portion of the solder plate.

16. The contact as described in claim 15, wherein the positioning means comprises a wall downwardly extending from a periphery of the solder plate.

17. The contact as described in claim 15, wherein the positioning means comprises peripheral walls of the passageway adjacent to a bottom surface of the housing whereby when the contact is received in the corresponding passageway of the housing the solder plate is positioned within the passageway.

18. The socket as described in claim 15, wherein the connecting section further comprises a retaining member attached to the solder plate for being received in a recess defined in the housing proximate the passageway thereby strengthening retention of the contact within the housing.

19. An electrical contact for use with a socket defining a plurality of passageways in a housing thereof, comprising:

an engaging section having an elongate main body, an engaging plate formed at one end of the main body for engaging with a conductive pin of a CPU, and a retaining plate formed at an opposite end of the main body for retaining the contact within the corresponding passageway; and a connecting section comprising a solder plate attached to the retaining plate of the engaging section; wherein at least an engaging protrusion downwardly extends from the retaining plate for engaging with corresponding openings defined in the solder plate.

20. An electrical contact for use with a socket defining a plurality of passageways in a housing thereof, comprising:

an engaging section having an elongate main body, an engaging plate formed at one end of the main body for engaging with a conductive pin of a CPU, and a retaining plate formed at an opposite end of the main body for retaining the contact within the corresponding passageway; and a connecting section comprising a solder plate attached to the retaining plate of the engaging section; wherein the connecting section further comprises a retaining member attached to the solder plate for being received in a recess defined in the housing proximate the passageway thereby strengthening retention of the contact within the housing.

21. An electrical contact for use with a socket defining a plurality of passageways in a housing thereof, comprising:

an engaging section having an elongate main body, an engaging plate formed at one end of the main body for engaging with a conductive pin of a CPU, and a retaining plate formed at an opposite end of the main body for retaining the contact within the corresponding passageway; and a connecting section comprising a solder plate attached to the retaining plate of the engaging section; wherein positioning means is provided on the solder plate for ensuring that a solder ball adheres to a central portion of the solder plate.

* * * * *